United States Patent [19]
Tomita

[11] Patent Number: 5,256,443
[45] Date of Patent: Oct. 26, 1993

[54] METHOD OF PRODUCING METALLIC THIN FILM SENSORS

[75] Inventor: Katsuhiko Tomita, Ohtsu, Japan

[73] Assignee: Horiba, Ltd., Kyoto, Japan

[21] Appl. No.: 883,666

[22] Filed: May 15, 1992

[30] Foreign Application Priority Data

May 18, 1991 [JP] Japan .................................. 3-142460

[51] Int. Cl.$^5$ ............................................. B05D 5/12
[52] U.S. Cl. ................................ 427/125; 427/126.5; 427/240; 427/241; 427/376.2; 427/376.3; 427/419.3; 427/421; 427/425; 427/430.1; 427/229
[58] Field of Search ................... 427/125, 126.5, 376.2, 427/376.3, 419.3, 240, 421, 430.1, 241, 425, 229; 501/12

[56] References Cited

U.S. PATENT DOCUMENTS

4,554,176 11/1985 Asano et al. ......................... 427/125
4,874,462 10/1989 Makita et al. ...................... 156/659.1

OTHER PUBLICATIONS

J. S. Reed, "Introduction to the Principles of Ceramic Processing," John Wiley & Sons Inc. 1988 pp. 403–405.
D. W. Johnson, Jr., "Sol-gel Processing of Ceramics and Glass," Ceramic Bulletin 64[12](1985) pp. 1597–1602.
S. Sakko et al., Journal of Materials Science Letters 2 (1983) pp. 395–396.

Primary Examiner—Shrive Beck
Assistant Examiner—Benjamin L. Utech
Attorney, Agent, or Firm—Price, Gess & Ubell

[57] ABSTRACT

A thin film made of a sol solution of noble metal alcoxides is formed on a substrate and then dried and baked in a reductive or oxidative atmosphere to produce a thin film of metals or metal oxides. The solution of noble metal alcoxides may contain merely a single component or a plurality of components. In addition, a solution of metal alcoxides with noble metal alcoxides as main components or additives may be used in place of the solution of noble metal alcoxides. The thin film of metals or metal oxides can be formed in a single layer or a plurality of layers on a substrate to improve, for example, the response of a sensor.

16 Claims, 3 Drawing Sheets

METHOD OF PRODUCING METALLIC THIN FILM SENSORS

BACKGROUND OF THE INVENTION

1. Field of the Invention

The present invention relates to a method of producing a metallic thin film, for example, a thin film formed on a substrate by using noble metal alkoxides alone or metal alkoxides with noble metal oxides as the main components on additives to thereby improve a pH-response sensor, a hydrogen sensor, a gas sensor, and other various types of applications.

2. Description of Related Art

Various methods have been known in the conventional art for applying a thin film to a substrate. For example, an evaporation method wherein a target is set within a vacuum bell jar has been utilized with the target being heated to a vaporization temperature to permit the resulting vapors to stick to a substrate, thereby forming a thin film. Additionally, a sputtering method wherein a target within a vacuum environment is struck, for example, by a glow discharge to thereby form a thin film on a substrate. An additional method of applying a thin film coating to a substrate is known wherein a metallic melt is prepared and a substrate is then immersed in the metallic melt to form a thin film followed by a subsequent drying and baking step. These methods of forming a thin metallic film are only illustrative of the attempts that have been made in the prior art.

A vapor deposition method or a sputtering method has frequently been found advantageous in permitting a uniform thickness of a thin film to be applied relatively free of impurities. The sputtering method is particularly suitable for a high melting point substance, for example, oxides. Problems have occurred, however, when a thin film is to be formed within a vacuum bell jar, since relatively complicated and expensive apparatus are required. In addition, if a metal oxide is selected as a target, it is usually necessary to regulate the purity of the oxide and if the target is porous, pretreatment is frequently required. Problems frequently occur when a thin film is to be made of multi-component metals or metal oxides and it is necessary to provide various kinds of targets in order to vapor-deposit or sputter the various materials from those targets simultaneously or sequentially with additional cost involved in the apparatus and procedure.

With the advent of inexpensive microcomputer systems capable of analyzing sensor information, for example, in the automotive environment, a need has been created for providing fairly inexpensive sensors. Accordingly, the prior art is still seeking to optimize the preparation of coating substrates with thin metallic films in an economical manner.

SUMMARY OF THE INVENTION

The present invention provides a method of producing a thin film of a mono-component or multi-component noble metal on a substrate in a relatively easy and inexpensive manner. This is accomplished by providing a substrate of an appropriate material, such as silicon or metals, such as Al, Au, Ti, or Ta. A sol solution containing at least a noble metal alkoxide is dissolved in, for example, an organic solvent. This sol solution, which can contain one or more noble metal alkoxides and base metals, depending on the desired application, can then coat the substrate with a predetermined thickness of the sol solution to provide a film layer on the substrate. The coating can be accomplished, for example, by a spraying, an immersing, or even a drip method wherein the substrate is rotated and the sol solution is dripped onto the substrate at a controlled drip rate relative to a controlled rotation rate. The coated substrate is then appropriately dried, for example, to a gelatinized state. The coated substrate can then be heated or baked in one of a reductive atmosphere or an oxidative atmosphere to form a thin film of noble metal.

The sol solution can also be formed by mixing the noble metal alkoxide with acetic acid as a catalyzer in the presence of a nitrogen gas. The noble metals can be selected from a group consisting of Au, Pt, Pd, Rh, Ir, Ru, Os, and Ag. One or a plurality of film layers can be provided on the substrates, either by repeating each of the steps or preparing a sol solution, coating the substrate with that solution, drying the coated substrate, and then baking the substrate to form a first film layer with a subsequent repeating of the steps to provide a second film layer with a different noble metal. Alternatively, the plurality of thin films can be provided by repeating the steps of preparing a sol solution of a different noble metal alkoxide, coating the substrate with one of the sol solutions, drying the coated substrate, and then repeating the coating of the substrate with a second solution. The number of layers of thin film of coated solutions can then be repeated and after the desired number of layers have been deposited, the coated substrate with the multiple layers can then be heated to fix the multiple layers.

For example, in producing an ion concentration measuring electrode, such as a pH sensor, an appropriate substrate is provided and then coated with a sol solution containing isopropoxy iridium and pantaethoxy tantalum. This solution is coated on the substrate to a predetermined thickness to form a film layer. The film layer is then dried and subsequently heated in, for example, an oxidative atmosphere to form a metal oxide film $Ta_2O_5$ with iridium.

BRIEF DESCRIPTION OF THE DRAWINGS

The objects and features of the present invention, which are believed to be novel, are set forth with particularity in the appended claims. The present invention, both as to its organization and manner of operation, together with further objects and advantages, may best be understood by reference to the following description, taken in connection with the accompanying drawings.

DESCRIPTION OF THE PREFERRED EMBODIMENTS

The following description is provided to enable any person skilled in the art to make and use the invention and sets forth the best modes contemplated by the inventor of carrying out his invention. Various modifications, however, will remain readily apparent to those skilled in the art, since the generic principles of the present invention have been defined herein specifically to provide a method of producing a metallic thin film for sensors.

Figure 1:
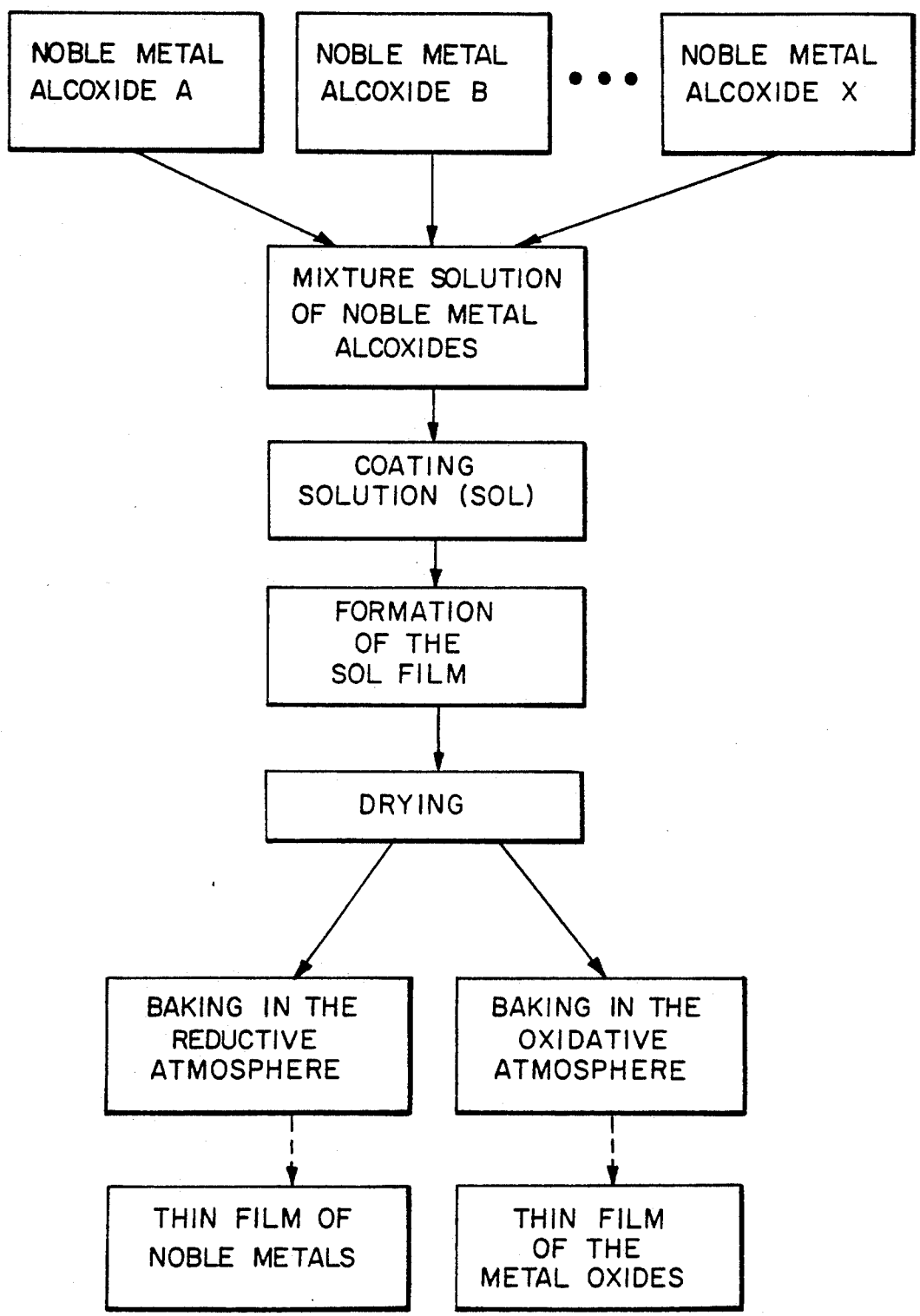
FIG. 1 is a schematic flow chart showing the present invention.

The following description of a preferred embodiment of a method of producing a metallic thin film according to the present invention is made with reference to the flow chart of FIG. 1.

A noble metal alkoxide mixture comprising noble metal alkoxides A. B . . . X is selected depending upon the particular use, at a desired ratio. The mixture is then dissolved in organic solvents to form a fluidic mixture solution of noble metal alkoxides (sol). This mixture solution is stirred enough to prepare a coating solution with the components homogenized. The resulting thin film is formed on the surface of a substrate made of Si or metals, such as Al, Au, Ti, or Ta. The particular method of forming the thin film on the substrate from the coating solution can be optionally selected.

Subsequently, a thin film made of the coating solution is dried by applying heat to cause the thin film to gelatinize at a thickness of about 1 $\mu$. The dried thin film is then baked in a reductive atmosphere to form a final thin film of a thickness of about 1000 to 2000 Å and made of a plurality of noble metals. To form a thin film made of a plurality of noble metal oxides, it can be baked in an oxidative atmosphere. The pressure of the baking atmosphere can be at sea level.

It is also possible to form a thin film made of one kind of noble metal, or noble metal oxide, by using any one kind of noble metal alkoxide selected from a plurality of noble metal alkoxides A, B.

In addition to the method shown in the flow chart of FIG. 1, the respective solutions of the noble metal alkoxides A, B . . . X may be prepared and then mixed.

Furthermore, it is also possible to form the thin film made of a plurality of metal or metal oxide containing noble metals from the coating solution prepared by mixing at least one of these noble metal alkoxides A, B . . . X with base metal alkoxides suitably selected.

The multi-layer thin film can also be formed by repeating the formation of the thin film made of metals or metal oxides, as described above.

Next, a first preferred embodiment using platinum as the noble metal is described with reference to FIGS. 2 to 3(A) and 3(B).

Figure 2:
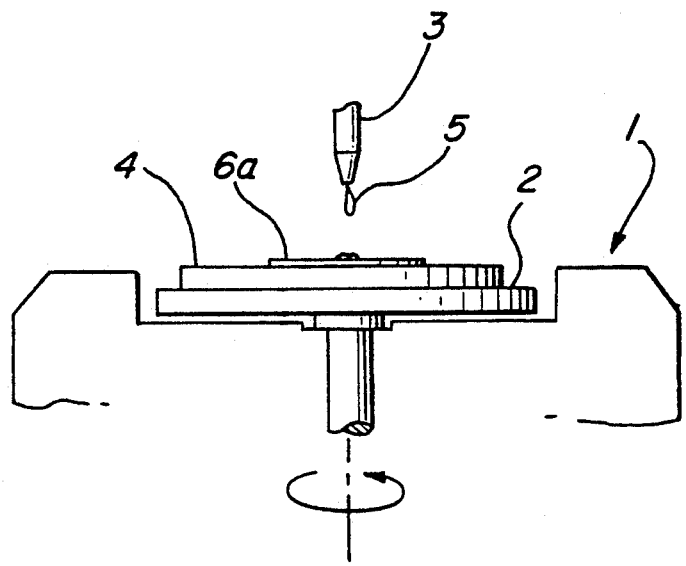
FIG. 2 is a schematic drawing showing a spin coating apparatus used in a first preferred embodiment.

Referring to FIG. 2, reference numeral 1 designates a spin coating apparatus comprising a turntable 2 revolved by means of a motor (not shown), and a nozzle 3 arranged above the center of the turntable 2 for applying the coating solution drop by drop.

Platinum alkoxides [Pt—(O—R)] (R: —CH$_3$, —C$_2$H$_5$, —C$_3$H$_7$) are dissolved in dehydrated ethyl alcohol in a quantity of 2.5% by weight. A quantity equivalent in mol to the alkoxides of acetic acid is added to the resulting solution as a catalyzer to sufficiently stir and mix the solution in a stream of nitrogen to avoid contact with moisture, thereby preparing a first coating solution.

Figure 3A:
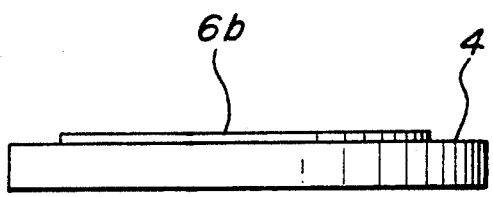
FIG. 3A and 3B are enlarged front views showing a substrate in the first preferred embodiment.

Subsequently, a substrate 4, made of Si, is placed at a central portion of the turntable 2 to revolve the substrate 4 by about 4,000 rpm, together with the turntable 2. The first coating solution 5 is applied on the substrate 4 from the nozzle 3, drop by drop, at a rate of 100 to 200 $\mu$l/ for about 30 seconds, followed by spin-coating the first coating solution on a surface of the substrate 4 to form a thin film 6a of about 1 $\mu$. The thin film 6a is dried for 30 minutes at 100° to 150° C. It is then baked for 30 minutes at 600° C. in a reductive atmosphere to form a Pt thin film 6b on the surface of the substrate 4, as shown in FIG. 3(a) of about 1000 to 2000 Å in thickness.

Figure 3B:
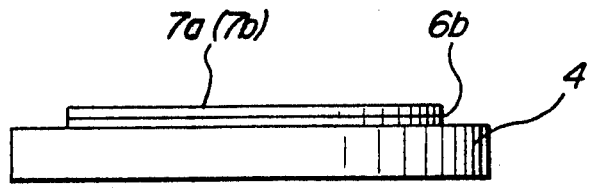

In addition, a second coating solution containing platinum alkoxides in a concentration of 5% by weight is prepared similarly to the first coating solution 5. The substrate 4, shown in FIG. 4(A) is again placed on the turntable 2 with the Pt thin film 6b on an upper side (not shown) to spin-coat the second coating solution on the Pt thin film 6b in the same manner as the first coating solution 5, thereby forming a thin film 7a, made of the second coating solution on the Pt thin film 6b, as shown in FIG. 3(B). The thin film 6b is dried under the same conditions as the thin film 6a. It is then baked for 30 minutes at 350° C. in the oxidative atmosphere to form a PtO thin film 7b, thereby forming a thin film made of noble metals. The thin film oxidizes in a layer on the substrate 4.

The thin films 6a and 7a, made of the first coating solution and the second coating solution containing platinum alkoxides, respectively, are formed in turn on the substrate 4. They are then baked in turn in a reductive, or oxidative, atmosphere to form a thin film made of noble metals and the thin film made of noble metal oxides in layers. This does not required complicated apparatus, and thus manufacturing expenses can be easily reduced.

The thickness of the thin film 6a and the thin film 7a, respectively, is determined by regulating the respective concentrations of the first coating solution and the second coating solution and a rotation frequency of the turntable 2. The temperature in the reductive atmosphere is set within a range of 600° to 600° C., and that in the oxidative atmosphere is set within a range of 300° to 400° C. Also, Nz, Hz, and the like, can be used as the reductive atmosphere. The rotation frequency of the turntable 2 is set within a range of 3,000 to 5,000 rpm.

Although a thin film made of noble metals and a thin film made of noble metal oxides are formed on the substrate 4 in a multitude of layers in this first preferred embodiment, both thin films can also be formed in a single layer.

When the thin film is formed in a multitude of layers, noble metal alkoxides forming these layers can be different from each other, and various kinds of metal alkoxides with noble metal alkoxides, as the main components or the additives, can be used. Additionally, a part of the plurality of layers of the thin film can be formed by using base metal alkoxides, or semiconductor alkoxides. It is therefore possible to form a multi-layer thin film in various types of combinations, such as metal oxide/noble metal oxide/noble metal, and noble metal/metal oxide/semiconductor, depending on the desired use of the multi-layer thin film.

A second preferred embodiment using a noble metal Ir as the additives to the base metals is described with reference to FIGS. 4 to 5.

In the second preferred embodiment, a suitable quantity of isopropoxy iridium [Ir(OC$_2$H$_5$)$_5$] as the noble metal alkoxides is added to pentaethoxy tantalum [Ta-(OC$_2$H$_5$)$_5$, as a tantalum alkoxide [Ta—(O—R)$_5$], to prepare a coating solution in the same manner as in the first preferred embodiment.

Figure 4:
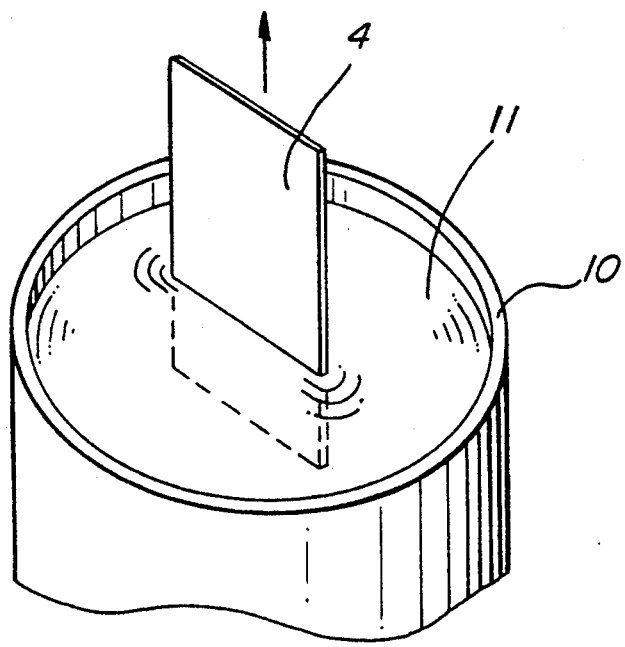
FIG. 4 is a perspective view showing thin film-forming means a second preferred embodiment.
Figure 5:
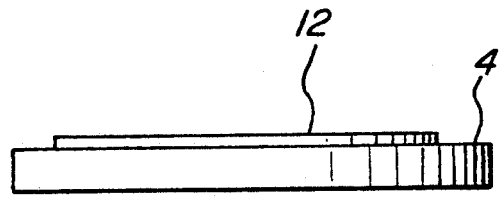
FIG. 5 is an enlarged front view showing a substrate in the second preferred embodiment.

Referring to FIG. 4, reference numeral 10 designates a vessel housing the coating solution 11 therein. The substrate 4 is immersed in the coating solution 11 and then withdrawn to form a thin film on the surface of the substrate 4. After it has dried, the thin film is baked in the oxidative atmosphere to form a metal oxide thin film 12, made of $Ta_2O_5$ with Ir added on the substrate 4, as shown in FIG. 5. The electrical resistance value of the metal oxide thin film 12 can be regulated within a range of a high-insulating valves to a low-insulating valves, for example, about $10^7$ to $10^4 \Omega$, by varying the molar ratio of isopropoxy iridium added.

The metal oxide thin film 12 can be used, for example, as a pH sensor, but oxides of Ir and other noble metals can be added to exhibit a response to pH, even when influenced by the oxidation and the reduction, so that the added noble metal Ir can improve the response of the thin film 12, when it is used as a pH sensor. For example, when the thin film 12 is formed on a substrate of ISFET, an ion concentration-measuring electrode superior in response can be constructed.

In addition to using metal alkoxides as additives in the second preferred embodiment, noble metal alkoxides may be used as the main components, and base metal alkoxides may be added to noble metal alkoxides. Although the thin film is formed in a single layer on the substrate 4 in the second preferred embodiment, it may also be formed in a plurality of layers, as shown in the first preferred embodiment.

As can be seen from the first and second preferred embodiments, noble metal alkoxides can be optionally selected, depending upon the desired use. If the thin film made of a coating solution containing, for example, palladium alkoxides (Pd—O—R, R:—$C_3H_7$, —$C_5H_9$) in a concentration of 10% by weight, dissolved in a dehydrated ethyl alcohol, is formed to be dried and baked, a porous metallic Pd thin film can be formed on a substrate of a MOSFET. The porous metallic Pd thin film can be used as a hydrogen sensor.

Additionally, if the thin film made of a coating solution containing Pt alkoxide is formed on a substrate of a MOSFET to be baked in the reductive or oxidative atmosphere, a Pt or PtO thin film is formed. This Pt or PtO thin film can be used as a gas sensor by a catalytic action thereof. Methanol, propanol, acetone, trichlene, acetyl acetone and the like may be used as organic solutions in addition to dehydrated ethyl alcohol.

When a coating solution containing a plurality of alkoxides for use in pH glass response film for example, alkoxides of Si, Lt, La, Ti, Ba, is prepared to form a pH-responsive film, and if the thin film made of noble metal alkoxides is used as an oxidative layer, the adhesion of the oxidative layer to the glass-responsive film can be improved, thus preventing any subsequent separation.

According to the above described method, a coating solution containing noble metal alkoxides, or metal alkoxides with noble metal alkoxides, as the main components, or as additives, is used and the resulting thin film is formed on the substrate. The thin film is baked in the reductive or oxidative atmosphere to form the metallic or metal oxide thin film.

Thus, it is possible to produce a component thin film in a highly efficient and inexpensive manner. When a multi-component thin film is formed, it is sufficient that the coating solution containing the respective noble metal alkoxides, or noble metal alkoxides and base metal alkoxides in mixture is prepared to form the thin film. It is therefore unnecessary to use complicated and large-scaled apparatus for forming the multi-component thin film, and thus it is possible to easily and inexpensively produce the multi-component thin film. Since the coating solution contains noble metal alkoxides, or noble metal alkoxides and metal alkoxides in mixture, the crystalline and amorphous structure of the respective ingredients, or the compactness of the porous thin film can be easily controlled. Thus, it is possible to produce a thin film having a structure in accordance with the desired use.

Additionally, a metallic thin film, or a metal oxide thin film, which is formed from the solution of optional metal alkoxides in the same manner as the above-described metallic or metal oxide thin film, can be stacked in layers. It is therefore possible to produce the thin film, having a structure corresponding to various ways of using it, by, for example, selecting the components of the thin film and determining the number of layers in the thin file.

Those skilled in the art will appreciate that various adaptations and modifications of the just-described preferred embodiment can be configured without departing from the scope and spirit of the invention. Therefore, it is to be understood that, within the scope of the appended claims, the invention may be practiced other than as specifically described herein.

What is claimed is:

1. In a method for forming sensors, the improvement comprising:
   providing a substrate;
   preparing a sol solution containing at least a noble metal alkoxide dissolved in a solvent;
   coating the substrate with a the sol solution to provide a film layer on the substrate;
   drying the film layer to a gelatinized state, and
   heating the film layer in one of a reductive atmosphere and an oxidative atmosphere to form a thin film made of the noble metal.

2. The invention of claim 1 wherein the solvent is dehydrated ethyl alcohol.

3. The invention of claim 2 wherein the sol solution is formed by mixing the noble metal alkoxide with acetic acid in the presence of nitrogen gas.

4. The invention of claim 3 wherein the substrate is coated by rotating it and dripping the sol solution on the rotating substrate.

5. The invention of claim 3 wherein the substrate is coated by being spraying with the sol solution.

6. The invention of claim 3 wherein the substrate is coated by dipping it into the sol solution.

7. The invention of claim 1 wherein the noble metal is platinum.

8. The invention of claim 1 wherein a plurality of different noble metal alkoxides are prepared into a sol solution with the noble metals selected from the group consisting of Au, Pt, Pd, Rh, Ir, Ru, Os, and Ag.

9. The invention of claim 8 wherein a plurality of film layers are provided by repeating the steps of preparing a sol solution, coating the substrate, drying the coated substrate with different sol solutions of noble metal alkoxides before the final heating step.

10. The invention of claim 8 wherein a plurality of film layers are provided by repeating the steps of preparing a sol solution of a different noble metal alkoxide, coating the substrate, dripping the coated substrate and heating the coated substrate after a first film layer is formed.

11. A method of producing an ion-concentration measuring electrode comprising:
    providing a substrate;
    preparing a sol solution containing isopropoxy iridium and pentaethoxy tantalum;

coating the substrate with the sol solution to provide a film layer on the substrate;
drying the film layer, and
heating the film layer in an oxidative atmosphere to form a metal oxide film $Ta_2O_5$ with Ir.

12. In a method for producing a metallic film, the improvement comprising:
providing a substrate;
preparing a sol solution containing at least a noble metal alkoxide dissolved in a solvent;
coating the substrate with the sol solution to provide a film layer on the substrate;
drying the film layer to a gelatinized state, and
heating the film layer in one of a reductive atmosphere and an oxidative atmosphere within an approximate temperature range of 300° to 600° C. to form a film made of the noble metal.

13. The invention of claim 12 wherein the noble metal is platinum.

14. The invention of claim 13 wherein the solvent is dehydrated ethyl alcohol and the platinum alkoxide is 2.5% to 5% by weight.

15. The invention of claim 12 wherein the reductive atmosphere is formed of one of $N_2$ and $H_2$.

16. The invention of claim 12 wherein the sol solution further contains a metal.

* * * * *